(12) United States Patent
Stein et al.

(10) Patent No.: US 9,172,388 B1
(45) Date of Patent: Oct. 27, 2015

(54) HIGH SPEED INTERLEAVED ADC WITH COMPENSATION FOR DC OFFSET MISMATCH

(71) Applicant: Guzik Technical Enterprises, Mountain View, CA (US)

(72) Inventors: Anatoli B. Stein, Atherton, CA (US); Semen P. Volfbeyn, Palo Alto, CA (US)

(73) Assignee: GUZIK TECHNICAL ENTERPRISES, Mountain View, CA (US)

( * ) Notice: Subject to any disclaimer, the term of this patent is extended or adjusted under 35 U.S.C. 154(b) by 0 days.

(21) Appl. No.: 14/735,386

(22) Filed: Jun. 10, 2015

Related U.S. Application Data

(60) Provisional application No. 62/011,326, filed on Jun. 12, 2014.

(51) Int. Cl.
*H03M 1/12* (2006.01)
*H03M 1/06* (2006.01)

(52) U.S. Cl.
CPC ............ *H03M 1/121* (2013.01); *H03M 1/0604* (2013.01); *H03M 1/0609* (2013.01)

(58) Field of Classification Search
CPC ............................. H03M 1/121; H03M 1/1215
See application file for complete search history.

(56) References Cited

U.S. PATENT DOCUMENTS 7,482,956 B2 * 1/2009 Huang et al. ................... 341/120
8,212,697 B2 * 7/2012 Jansson et al. ................. 341/118
8,836,550 B2 * 9/2014 Snelgrove ...................... 341/118

OTHER PUBLICATIONS

Tsai et al., Correction of Mismatches in a Time-Interleaved Analog-to-Digital Converter in an Adaptively Equalized Digital Communication Receiver, IEEE Transactions on Circuits and Systems—I: Regular Papers, vol. 56, No. 2, Feb. 2009.*
Fu et al., A Digital Background Calibration Technique for Time-Interleaved Analog-to-Digital Converters, IEEE Journal of Solid-State Circuits, vol. 33, No. 12, Dec. 1998.*
Black et al., Time Interleaved Converter Arrays, IEEE Journal of Solid-State Circuits, vol. SC-15, No. 6, Dec. 1980.*

* cited by examiner

*Primary Examiner* — Howard Williams
(74) *Attorney, Agent, or Firm* — Burns & Levinson LLP; Joseph M. Maraia

(57) ABSTRACT

An analog to digital conversion device with DC offset mismatch compensation comprises a composite analog to digital converter (ADC) consisting of N interleaved sub-ADCs, a DC offset accumulator, an averaging unit, a subtraction unit, and a compensation unit. The ADC generates a stream of digital samples corresponding to signal values at an analog input to the ADC. The digital stream is a combination of N partial signals produced by the respective sub-ADCs. The DC offset accumulator measures and stores DC offsets of the respective partial signals. The averaging unit calculates an average value of DC offsets of the respective N partial signals. The subtraction unit is responsive to the DC offsets of the respective partial signals and the average value of the DC offsets, to produce a signal representative of the differences between the values arriving at a DC offset input and the value arriving at an average value input. The subtraction unit is responsive to the DC offsets of the respective partial signals and the average value of the DC offsets, to produce a signal representative of the differences between the values arriving at the DC offset input and the value arriving at the average value input. The compensation unit corrects the digital stream from the ADC by subtracting the differences from the stream from the ADC.

14 Claims, 4 Drawing Sheets

HIGH SPEED INTERLEAVED ADC WITH COMPENSATION FOR DC OFFSET MISMATCH

RELATED APPLICATION(S)

This application claims the benefit of U.S. Provisional Application No. 62/011,326, filed on Jun. 12, 2014, the entire teachings of the above application is incorporated herein by reference.

FIELD OF TECHNOLOGY

The technology relates to high speed interleaved analog to digital converters (ADCs) and, more particularly, to correction of direct current (DC) offset mismatch in individual sub-ADCs of such converters.

BACKGROUND

High speed ADCs are widely used in data processing, in communication systems, in digital oscilloscopes and in other applications. One way to provide for high speed analog to digital conversion in such devices is to use a composite ADC that consists of a number of interleaved sub-ADCs with a common input and sequential timing. In such a case, each sub-ADC generates a partial signal that has a lower data rate than the data rate of the ADC as a whole. All the partial signals are combined into one high speed digital signal that is produced at the output of the composite ADC.

The construction of a high speed ADC comprising a set of interleaved sub-ADCs has a drawback. The signal processing associated with different paths through the various sub-ADCs differs slightly from one sub-ADC to the next. The slight differences occur principally because of variations of the manufacturing processes and the distinctions between hardware components. As a result, each of the partial signals experiences a distinct processing variation and hence, certain aspects of the signals vary across the sub-ADCs.

In particular, each of the partial signals may acquire in the course of conversion, a different DC offset. This mismatch of DC offsets in different sub-ADCs causes specific distortions in the digital signal produced by a composite ADC, the most significant being an appearance of spurious frequency components.

A number of prior art patents propose different ways to eliminate or to reduce DC offsets in composite ADCs, for example, U.S. Pat. No. 7,477,885, U.S. Pat. No. 7,894,561, and U.S. Pat. No. 8,036,622. However, the proposed devices of those patents correct DC offset of a composite ADC as a whole, while mismatch of DC offsets between different sub-ADCs of the respective prior art composite ADCs remains unchanged.

A method and apparatus for compensating mismatch of DC offsets in parallel processing of digital signals is suggested in U.S. Pat. No. 8,294,606. In that patent, it is proposed to process each partial signal that is produced by a sub-ADC of a composite ADC, in a device of a type shown in FIG. 1. The part of the block diagram within dashed line 14 functions as an accumulator. Samples that are applied to an input of the accumulator from block 11, are added in an adder 13 to a value that has been stored in a delay unit 12. A sum that is produced at an output of the adder 13 is loaded into the delay unit 12 as a new accumulated value. In that way, the accumulator 14 compiles a mean value of a sequence of samples that are applied from an output of an adder 10. In adder 10, the accumulated mean value is subtracted from an applied input signal.

The above-described operation of the device in FIG. 1 reduces practically to zero, any DC component in each partial signal of the there-disclosed composite ADC. In that way, the DC offset is removed in each partial signal, eliminating mismatch of DC offsets that existed in the combined signal. However, that proposed procedure for DC offset mismatch compensation of U.S. Pat. No. 8,294,606 has a substantial drawback. Namely, in the frequency domain, the device of the block diagram in FIG. 1 is equivalent to a high pass filter. As a consequence, relatively low frequency components of an input signal are subject to relatively high attenuation compared to attenuation of relatively high frequency components, while a DC component of the input signal does not pass through the proposed device at all. Because of that blocking of DC components, the procedure for DC offset mismatch compensation of U.S. Pat. No. 8,294,606 is problematic for applications of composite ADCs where the DC component of the processed signal carries essential information, as is the case in digital measuring instruments, such as digital oscilloscopes and other similar devices. The method of U.S. Pat. No. 8,294,606 cannot be used in such applications, as well as in applications, where the frequency distortions of processed signal are intolerable The present technology provides a device that removes DC offset mismatches in a composite ADC, while passing the DC component, without distortions of processed signal properties.

SUMMARY

Different sub-ADCs of a composite ADC produce partial signals that are combined into an output digital signal. A device according to the present technology eliminates DC offset mismatch that occurs for the different partial signals from the respective sub-ADCs, without suppression of the DC component and without frequency distortions of the processed signal.

The compensation of the DC offset mismatch in a composite ADC is accomplished by:

1. Measuring of DC offset of each partial signal incorporated in the digital signal at the output of the composite ADC;
2. Calculating the average of the DC offset over the assembly of partial signals by adding up all DC offsets, followed by division by the number N of sub-ADCs in the composite ADC;
3. Calculating the deviation of the DC offset in each partial signal from the average of the DC offsets by subtraction the calculated average from the DC offset of the partial signal; and
4. Correcting the DC offset mismatch by subtracting from each partial signal, the deviation of its DC offset from the average.

DETAILED DESCRIPTION

Figure 1:
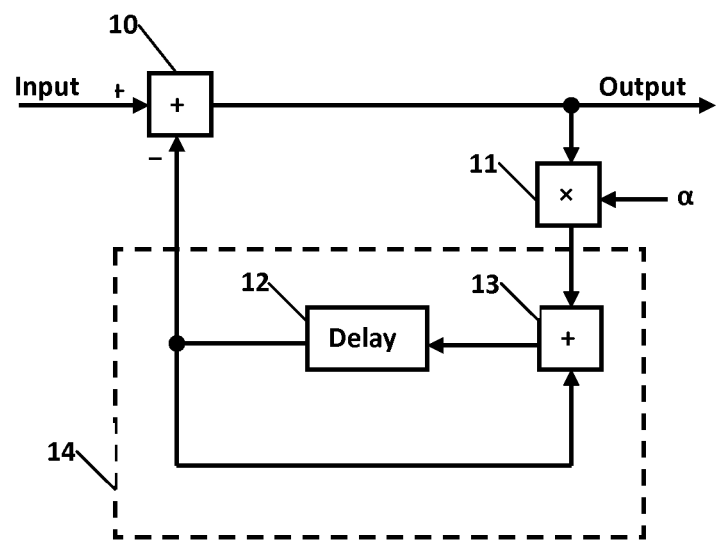
FIG. 1 shows a block diagram of a device for the correction of the DC offsets mismatch according the prior art.
Figure 2:
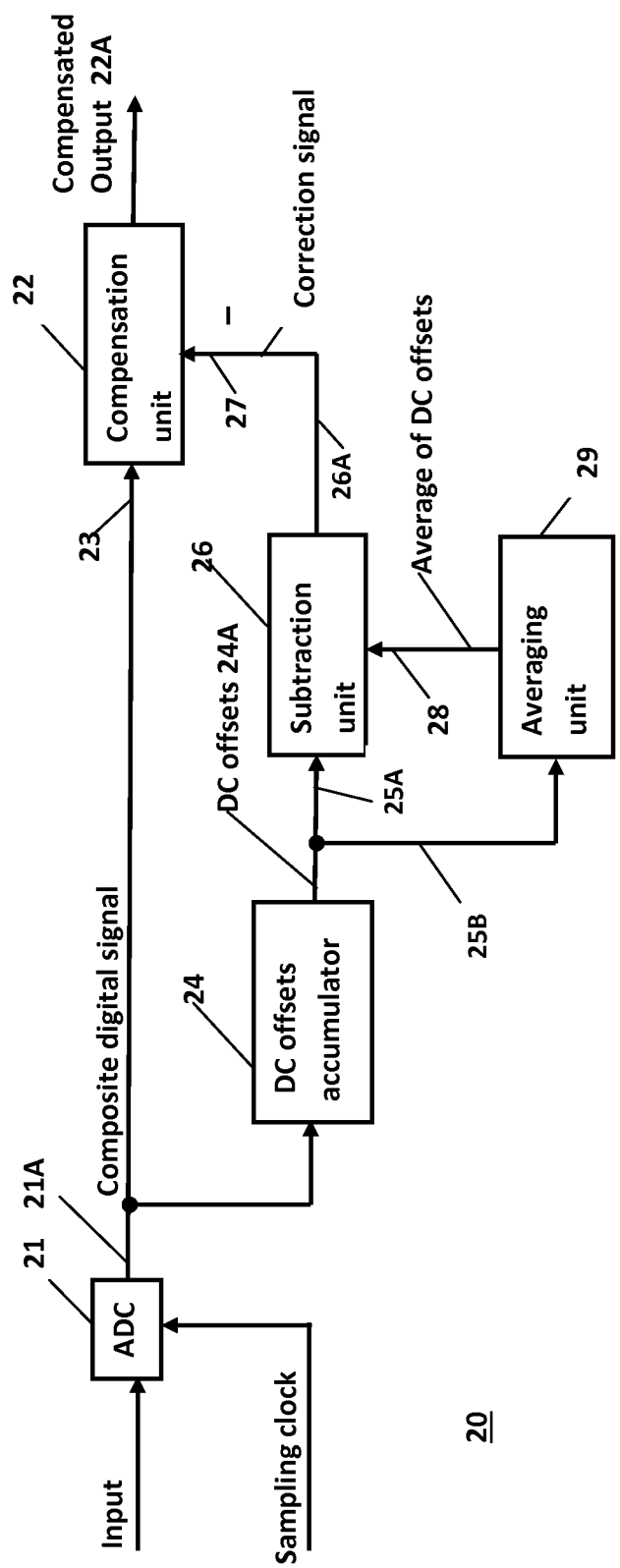
FIG. 2 shows a block diagram of an exemplary analog to digital conversion device with DC offsets mismatch compensation according to the present technology.

A block diagram of an exemplary analog to digital conversion device 20, with DC offset mismatch compensation according to the present technology, is shown in the FIG. 2. In that block diagram, an input analog signal is applied to a signal input of a composite analog to digital converter (ADC) 21 and a sampling clock is applied to a clock input of ADC 21. The ADC 21 consists of N interleaved sub-ADCs with a common input and sequential timing. Each sub-ADC converts the input analog signal into a partial digital signal. All partial signals are combined into a composite digital signal that is produced at an ADC output of ADC 21.

The composite digital signal is applied to an input of a DC offsets accumulator 24. The DC offsets accumulator 24, comprises a storage device (for example, a shift register) that accumulates mean values of all partial signals incorporated in the composite digital signal at the ADC output of ADC 21. In that way, a DC offset for each partial signal is determined (or "measured"). The set of the determined DC offsets is produced at the output 24A of the DC offsets accumulator 24.

The output 24A of the DC offsets accumulator 24 is connected to respective inputs 25A and 25 B of an averaging unit 29 and a subtraction unit 26. The averaging unit 29 receives from the DC offsets accumulator 24, the set of measured DC offsets for all partial signals. In averaging unit 29, those DC offsets are added up and the resulting sum is divided by number N (corresponding to the number of sub-ADCs in ADC 21). In that way, an average of the determined (or "measured") DC offsets is determined and transferred to an output 29A of the averaging unit 29.

The subtraction unit 26 has two inputs: a DC offsets input 25A and an average value input 29A. Through the DC offsets input 25, the subtraction unit 26 receives from the DC offsets accumulator 24 by way of output 24A, the set of measured DC offsets for all partial signals. Through the average value input 28, the subtraction unit 26 receives from the averaging unit 29, the average of the measured DC offsets. In subtraction unit 29, this average is subtracted from DC offset of each partial signal, resulting in a set of N difference signals at an output 26A of subtraction unit 26. The N difference signals on output 26A of subtraction unit 26 are applied to an input of a compensation unit 22, and serve as correction signals for DC offsets mismatch compensation.

The compensation unit 22 has a signal input 23 that is connected to the ADC output of the ADC 21 and a correction signals input 27 that is connected to the output 26A of the subtraction unit 26. Through the signal input 23, the compensation unit 22 receives from the ADC 21, a digital signal that consists of N partial signals. Through the correction signals input 27, the compensation unit 22 receives from the subtraction unit 26, a set of N corrections signals, each correction signal corresponding to an associated partial signal. In the compensation unit 22, each correction signal is subtracted from its associated partial signal. After an N-times repeated subtraction in compensation unit 22, an assembly of the partial signals forms an output composite digital signal which is compensated for DC offsets mismatch. The output composite digital signal is placed at a compensated output 22A of the compensation unit 22, which serves as the output of the device 20.

Figure 3:
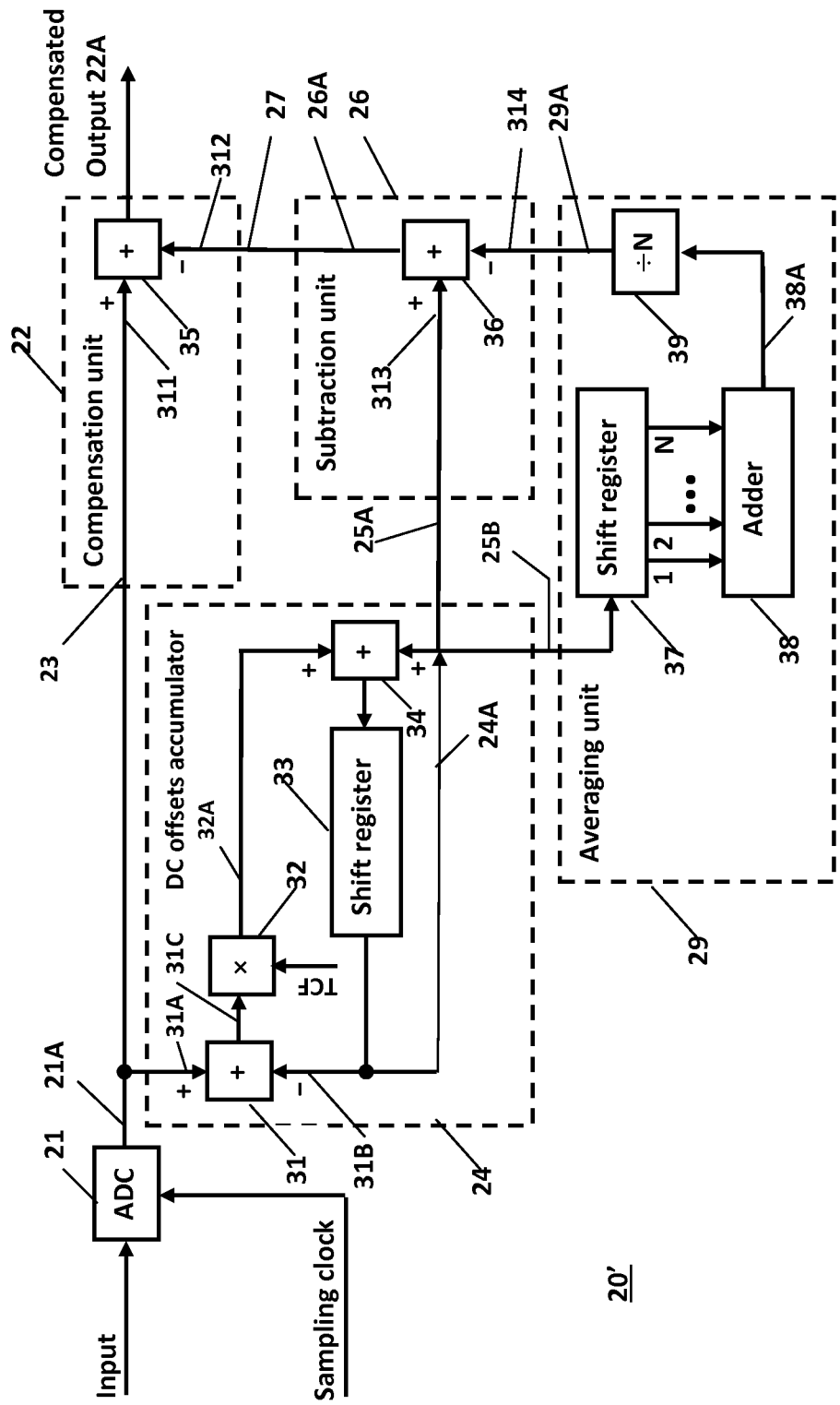
FIG. 3 shows a block diagram of an exemplary embodiment of the present technology with time division of partial signals.

A more detailed block diagram of an embodiment 20' of the present technology, illustrating exemplary components of the elements set forth in FIG. 2, as well as connections between those components, is shown in FIG. 3. Units, or components, in FIG. 3 which correspond to units, or components, in FIG. 2, are identified with the same reference designations.

As described above in conjunction with FIG. 2, the ADC 21 in FIG. 3 produces at its ADC output, a composite digital signal with data rate S that equals the sampling clock frequency. The sequence of samples that form the digital signal is separated into groups, each group containing N samples, where N is, as before, the number of sub-ADCs in the ADC 21. In a form, the separation is effected in such a way that the number i of a sample position in a group ($1 \leq i \leq N$) coincides with the number i of sub-ADC, which has produced the sample, and with the number i of an associated partial signal. The sub-ADCs of ADC 21 operate at a sample rate S/N, in response to interleaved separate clock sample signals, each being shifted by 1/N of the data rate with respect to its neighbors in the set of interleaved clock sample signals.

The digital signal from the output of ADC 21 is applied to input 31A of the DC offsets accumulator 24. As described above in conjunction with FIG. 2, the DC offsets accumulator 24 determines (or "measures") DC offsets of the respective partial signals. The determined DC offsets are accumulated, or stored, in a storage device (shift register 33) of the DC offsets accumulator 24. The shift register 33 is advanced at sampling rate S by the sampling clock of ADC 21 (not shown in the DC offsets accumulator 24 of FIG. 3 for simplicity).

At a sampling interval when a sample of a partial signal with number i arrives at a summing input 31A of subtracting adder 31, the shift register 33 produces at its output, an accumulated DC offset of this partial signal.

The output of the shift register 33 is connected to a differencing input 31B of the subtracting adder 31, with the summing input 31A of the subtracting adder 31 being the input of the DC offsets accumulator 24. The subtracting adder 31 subtracts from the sample of the partial signal with number i, the accumulated DC offset that corresponds to that signal, and that has been stored in the shift register 33. The resultant difference is provided at an output 31C of the subtracting adder 31. That resultant difference equals the deviation of the incoming sample from the accumulated DC offset of the associated partial signal.

The so-determined deviation is multiplied by a time constant factor (TCF) in a multiplier 32 to produce a product signal at a multiplier output 32A. The time constant factor TCF controls the speed with which the DC offsets accumulator 24 tracks the changes in the DC offset of a partial signal. The product signal produced by the multiplier 32 at multiplier output 32A, is added to the output of the shift register 33 in an adder 34. The resultant sum is loaded into the shift register 33 as a fresh accumulated DC offset of the partial signal with the number i. The same accumulated DC offset is placed at the output 24A of the DC offsets accumulator 24.

The output 24A of the DC offsets accumulator 24 is connected to an input 25B of the averaging unit 29. The DC offsets accumulated in the DC offsets accumulator 24 arrive one after another at the input 25B of the averaging unit 29, and are loaded into a shift register 37. The shift register 37 is advanced at sampling rate S by the sampling clock of ADC 21 (not shown in the DC offsets accumulator 24 of FIG. 3 for simplicity). Shift register 37 has N cells, the contents of which appear at N respective register outputs. The shift register 37 transforms successive groups of N samples into parallel-spread groups. At any sampling interval, a set of N DC offsets, one for each partial signal, is present at the respective outputs of the shift register 37. The set of N DC offsets are applied to respective inputs of an adder 38 of the averaging unit 29.

The adder 38 forms at an adder output 38A, a sum of the applied partial signal DC offsets. The sum of partial signal DC offsets is applied to an input of a "divide-by-N" divider 39, which divides the applied sum by N, producing an average of partial signal DC offsets that is placed at a divider output 39A of the averaging unit 29.

The subtracting unit 26 in the embodiment of FIG. 3 is implemented as a subtracting adder 36. This subtracting adder 36 receives at a summing input 313, DC offsets of partial signals from the DC offsets accumulator 24, and at a differencing input 314, the average of DC offsets from the divider output 39A of averaging unit 29. The average of DC offsets is subtracted from each partial signal DC offset to produce a set of deviations of DC offsets from the average. These deviations create a description of the DC offsets mismatch in the processed signal. In the described embodiments, those values provide correction-effecting signals for the associated partial signals, and are transmitted to a differencing input 312 of a subtracting adder 35 in the compensation unit 22. The partial signals of the ADC Output 21A are applied via input line 23 to a summing input 311 of a subtracting adder 35 of the compensation unit 22.

The subtracting adder 35 subtracts from each partial signal the associated deviation of its DC offset from the average, and thereby performs compensation for DC offset mismatches. The resultant corrected digital signal is placed at the output 22A of the device 20'.

In the above-described embodiment, the partial signals are combined into the composite digital signal by a time division technique. For this reason, the device 20 requires a relatively limited amount of computing resources. However, since the device components in that embodiment operate at the sampling clock frequency, it may be used in software-based applications, or in hardware that operates in a not-real time mode. An ability to operate in a real time mode may be achieved by a decrease of the device operational frequency through implementation of parallel operation of similar or identical components. Such an approach is employed in another embodiment 20" of the technology illustrated in block diagram form in FIG. 4.

Figure 4:
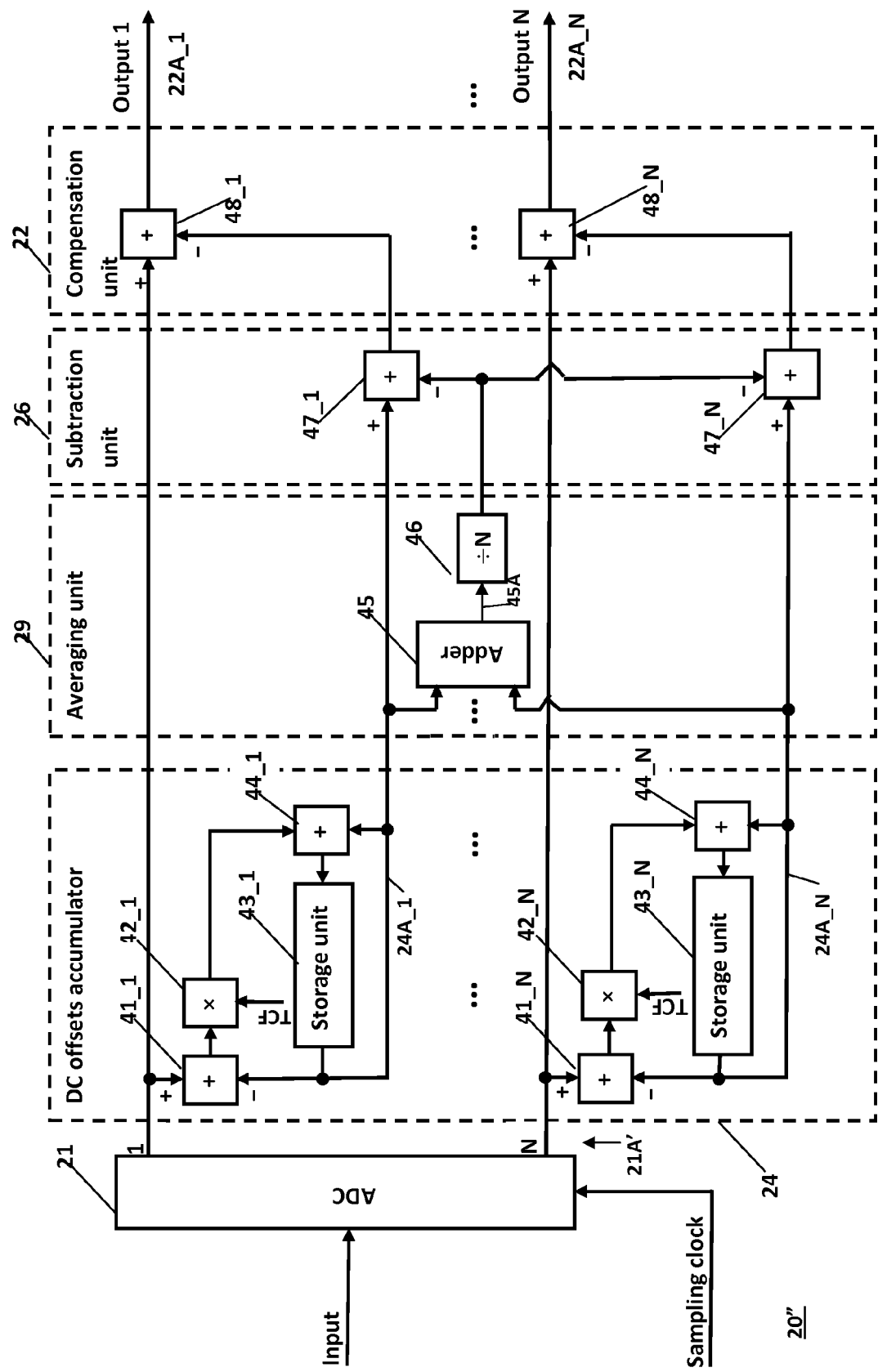
FIG. 4 shows a block diagram of an embodiment of the present technology with parallel processing of partial signals.

ADC 21 in FIG. 4 is adapted for use with a demultiplexer that splits the output digital signal of ADC 21 into N partial signals. The data rate of each partial signal equals the sampling clock frequency divided by N, so that a sample of any partial signal occupies a time interval with a duration equal to N sampling intervals. The partial signals are transmitted out over N signal lines that form an output bus 21A' of ADC 21.

This bus 21A' connects ADC Output of ADC 21 to an input of an N-element DC offsets accumulator 24. As before, the partial signals accumulator 24 determines (or "measures") the DC offsets of the partial signals incorporated in the digital signal at the respective N lines of its input. The DC offsets accumulator 24 consists of N individual accumulators. An individual accumulator with the number i measures the DC offset of the partial signal with the same number i. The storage devices of the individual accumulators intended for storing the respective accumulated DC offsets, are implemented in the form of a storage unit $43\_i$. Each of the storage units is refreshed with a frequency that equals the frequency of the sampling clock divided by N.

The input of an individual accumulator with the number i coincides with the first input of the subtracting adder $41\_i$ ($1 \leq i \leq N$) that is connected to the associated signal line of the input bus 21A' of the partial signals accumulator 24. The bus 21A' connects respective inputs of the DC offsets accumulator 24 to associated outputs of the composite ADC 21. In that way, a summing input of the $i^{th}$ subtracting adder $41\_i$, receives the partial signal with the number i. The differencing input of the subtracting adder $41\_i$ is connected to the output 24A_i of the storage unit $43\_i$. The subtracting adder $41\_i$ subtracts the accumulated mean value that has been kept in the storage unit $43\_i$ from the incoming sample of the partial signal with the number i. The difference is produced at the output of the subtracting adder $41\_i$.

The so-determined difference is multiplied by the time constant factor (TCF) in a multiplier $42\_i$, and the product is added to the output of the storage unit $43\_i$. The sum is loaded into the storage unit $43\_i$ as a fresh accumulated DC offset. The same accumulated DC offset is placed on the output of the individual accumulator and through it on the signal line with the number i in an N-line accumulator output bus 24A_i of the DC offsets accumulator 24.

This N-line accumulator output bus 24A_i connects the DC offsets accumulator 24 to N inputs of the averaging unit 29. The adder 45 of the averaging unit 29 receives at its inputs, DC offsets of the partial signals and produces at its adder output 45A, their sum. This sum is divided by N in the divider 46 and the resulting average of partial signals DC offsets is placed at the output of the averaging unit 29.

A subtraction unit 26 consists of subtracting adders $47\_1, \ldots, 47\_N$. A summing input of each of subtracting adders $47\_1, \ldots, 47\_N$, is connected to the associated signal line of the bus that couples the DC offsets input of the subtraction unit 26 with the output of the DC offsets accumulator 24. Differencing inputs of all subtracting adders $47\_1, \ldots, 47\_N$ are joined together to be used as average value input of the subtraction unit 26. In that way, the summing input of the subtracting adder $47\_i$ receives a DC offset of the partial signal with a number i and the differencing input of the subtracting adder $47\_i$ receives the average of partial signals DC offsets. The difference signal that is produced by the subtracting adder $47\_i$ equals the deviation of DC offset of the partial signal with a number i from the average of partial signals DC offsets. Hence the necessary correction signal for DC offset of the partial signal with a number i is obtained. This correction signal is put on a signal line with the number i in an output bus of the subtraction unit 26.

A compensation unit 22 consists of subtracting adders $48\_1, \ldots, 48\_N$. A summing of each subtracting adder is connected to an associated signal line of the bus that couples the signal input of the compensation unit 22 with the output of the ADC 21. A differencing input of each subtracting adder is connected to an associated signal line of the bus that couples the correction signals input of the compensation unit 22 with the output of the subtraction unit 26. The subtracting adder $48\_i$ subtracts from each partial signal, the associated deviation of its DC offset from the average, and performs in that way, compensation of DC offsets mismatch. The corrected partial signal is placed on an associated signal line of the output bus of device 20".

One skilled in the art will realize the technology may be embodied in other specific forms without departing from the spirit or essential characteristics thereof. For example, an alternative embodiment of the technology has a number of components operating in parallel that is equal to either a divider or a multiple of the number N of sub-ADCs in the composite ADC. The foregoing embodiments are therefore to be considered in all respects illustrative rather than limiting of the technology described herein. The scope of the technology is thus indicated by the appended claims, rather than by the foregoing description, and all changes that come within the meaning and range of equivalency of the claims are therefore intended to be embraced therein.

What is claimed is:

1. An analog to digital conversion device with DC offset mismatch compensation, comprising:
   a composite analog to digital converter (ADC) characterized by a system sampling rate S and including N interleaved sub-ADCs,
       wherein the ADC includes an analog input common to inputs of the N sub-ADCs, and a composite ADC output,
       wherein the N sub-ADCs each include a sampling clock input for receiving an associated one of a set of interleaved sequences of sub-ADC sampling clock signals having sub-ADC sampling clock rates S/N,
       wherein each of the respective sub-ADCs is responsive to its associated sub-ADC sampling clock signal and an analog signal at the input of the ADC, to generate and provide at an associated sub-ADC output, a stream of digital samples of a partial converted digital signal corresponding to portions of an analog signal at the analog input at the sample times of the respective sub-ADC sampling clock signals, and characterized by a DC offset associated with the respective one of the sub-ADCs and otherwise corresponding to instantaneous values of an associated portion of the analog signal,
       wherein the composite ADC is responsive to the streams of digital samples provided by the respective sub-ADCs, to generate and provide at the output of the ADC, a composite ADC output signal including the partial converted digital signals from the N sub-ADCs,
   a DC offsets accumulator having an input connected to the output of the ADC and an output, said DC offsets accumulator being adapted to measure and provide at its output, a DC offset of each partial converted digital signal provided at the output of the ADC, an averaging unit having an input connected to the output of the DC offsets accumulator, and an output, wherein the averaging unit is responsive to the measurements provided at the outputs of the DC offsets accumulator, to calculate and provide at an averaging unit output, a value corresponding to an average value of the measured DC offsets of the respective partial converted digital signals;
   a subtraction unit having a DC offsets input connected to the outputs of the DC offsets accumulator, an average value input connected to the output of the averaging unit, and an output, wherein the subtraction unit generates and provides at its output, corrections signals corresponding to differences between the measured DC offset of each partial converted digital signal provided at the output of the ADC and the average value of the measured DC offsets of the respective partial converted digital signals provided by the averaging unit, and
   a compensation unit having a signal input connected to the output of the composite ADC, a correction input connected to the output of the subtraction unit, and an output, wherein the compensation unit subtracts the corrections signals at the correction input from the corresponding partial converted digital signals at the signal input, thereby providing at the output of the compensation unit, a sequence of digital samples at the system sampling rate S corresponding to all portions of the analog signal and characterized by substantially no DC offset mismatch for the respective portions of the analog signal.

2. An analog to digital conversion device with DC offsets mismatch compensation as in claim 1, wherein the DC offsets accumulator comprises:
   a subtracting adder having a first input providing an input of the DC offsets accumulator, a second input and an output, wherein the subtracting adder produces at its output, a difference between a value at its first input and a value at its second input;
   a multiplier having a first input connected to the output of the subtracting adder, a second input and an output, wherein the multiplier produces at its output, a product value of a sample from the output of the subtracting adder at its first input and a time constant factor that is continuously applied to its second input;
   a shift register with N cells coupled between an input and an output,
       wherein its output is connected to the second input of the subtracting adder and provides an output of the DC offsets accumulator, and
       wherein the shift register of the DC offsets accumulator transfers a sample from its input to its output with a delay for N sampling intervals;
   an adder having a first input connected to the output of the multiplier, a second input connected to the output of the shift register, and an output connected to the input of the shift register.

3. An analog to digital conversion device with DC offsets mismatch compensation as in claim 2, wherein the averaging unit comprises:
   a shift register with N cells having an input providing an input of the averaging unit, and N outputs, wherein each output is associated with a cell of the shift register,
       wherein the shift register transforms a group of N consecutive samples received at its input from the output of the DC offsets accumulator, into a group of N parallel transmitted samples at N outputs;
   an adder having N inputs connected to the respective N outputs of the shift register, and an output, wherein the adder produces at its output, a value corresponding to a sum of values at its inputs; and
   a divider having an input connected to the output of the adder, and an output which provides an output of the averaging unit, and
       wherein the divider provides at its output, a value representative of a value at its input divided by N.

4. An analog to digital conversion device with DC offsets mismatch compensation as in claim 3, wherein the subtraction unit comprises an adder having a DC offsets input, an average value input and an output, wherein its DC offsets input is connected to the output of the DC offsets accumulator, its average value input is connected to the output of the averaging unit, and
   wherein the adder provides at its output, a difference between a value at the DC offsets input and the value arriving at the average value input.

5. An analog to digital conversion device with DC offsets mismatch compensation as in claim 4, wherein the compensation unit comprises an subtracting adder having a signal input, a correction input and an output, wherein the signal input is connected to the output of the ADC and the correction input is connected to the output of the subtraction unit, and
   wherein the subtracting adder provides at its output, a difference between a value at the signal input of the compensation unit and a value at the correction signal input of the compensation unit.

6. An analog to digital conversion device with DC offsets mismatch compensation as in claim 1, wherein the composite analog to digital converter comprises a demultiplexer between the outputs of the respective sub-ADCs and the output of the ADC, wherein the demultiplexer establishes the N partial converted digital signals from the respective sub-ADCs into N partial converted digital signals as a composite signal containing all of the N partial converted digital signals as a single signal forming the output of the composite ADC.

7. An analog to digital conversion device with DC offsets mismatch compensation as in claim 6,
wherein the DC offsets accumulator comprises K individual accumulators, each individual accumulator having an input and an output,
wherein the inputs of the K individual accumulators inputs form the input of the DC offsets accumulator and the outputs of the K individual accumulators outputs form the outputs of the DC offsets accumulator.

8. An analog to digital conversion device with DC offsets mismatch compensation as in claim 7, wherein each individual accumulator comprises:
a subtracting adder having a first input providing an input of the individual accumulator, a second input and an output, wherein the subtracting adder provides at its output a difference between a value at its first input and a value at its second input;
a multiplier having a first input connected to the output of the subtracting adder, a second input and an output, wherein the multiplier provides at its output, a product of a sample that is present at its first input and a time constant factor that is continuously applied to its second input;
a storage unit having an input and an output, wherein the output is connected to the second input of the subtracting adder and provides an output of the individual accumulator, wherein the storage unit transfers a sample from its input to its output with a delay for N sampling intervals; and
an adder having a first input connected to the output of the multiplier, a second input connected to the output of the storage unit, and an output connected to the input of the storage unit.

9. An analog to digital conversion device with DC offsets mismatch compensation as in claim 8, wherein the averaging unit comprises:
an adder with N inputs that form together the input of the averaging unit, and an output; and
a divider, having an input connected to the output of the adder, and an output which provides the output of the averaging unit, wherein the divider provides at its output, a value at its input divided by N.

10. An analog to digital conversion device with DC offsets mismatch compensation as in claim 9, wherein the subtraction unit comprises N subtracting adders, wherein each subtracting adder having a first input, a second input and an output, and provides at its output, a difference between a value at its first input and a value at its second input, wherein the first inputs of the N subtracting adders form the DC offsets input of the subtraction unit, the second inputs of subtracting adders are joined together to form the average value input of the subtraction unit, and the outputs of the N subtracting adders form the output of the subtraction unit.

11. An analog to digital conversion device with DC offsets mismatch compensation as in claim 10, wherein the compensation unit comprises N subtracting adders, wherein each subtracting adder has a first input, a second input and an output, and provides at its output, a difference between a value at its first input and a value at its second input, and wherein the N first inputs of all of the subtracting adders form the signal input of the compensation unit, the N second inputs of all of the subtracting adders form the correction signals input of the compensation unit, and the N outputs of all of the subtracting adders form the output of the compensation unit.

12. An analog to digital conversion device characterized by a system sampling rate S, comprising:
A. a composite analog to digital converter (ADC) including N interleaved sub-ADCs, where N is greater than 1, and wherein the ADC has an analog input common to inputs of the N sub-ADCs,
wherein each sub-ADC:
i. has an associated sampling clock input and a sub-ADC output, and
ii. is responsive to an analog signal at the analog input and an associated one of a set of interleaved sequences of sub-ADC sampling clock signals having a sub-ADC sampling clock rate S/N, at its sampling clock input, to generate and provide at its associated sub-ADC output, a partial digital signal including a corresponding sequence of digital samples at the sub-ADC sampling clock rate and characterized by a DC offset associated with the respective one of the sub-ADCs and otherwise corresponding to instantaneous values of an associated portion of the analog signal;
B. a DC offsets accumulator responsive to the partial converted digital signals provided at the respective sub-ADC outputs, to measure and provide at DC offsets accumulator outputs, the DC offsets associated with the digital samples for each of the respective portions of the analog signal;
C. an averaging unit responsive to the respective outputs of the DC offsets accumulator, to generate and provide at an averaging unit output, an offset average signal corresponding to an average of the measured DC offsets of the respective sub-ADCs;
D. a subtraction unit responsive to the respective measured DC offsets of the respective sub-ADCs provided at the DC offsets accumulator outputs, and the offset average signal provided at the averaging unit output, to generate and provide at a subtraction unit output, correction signals corresponding to differences of each of the measured DC offsets of the respective sub-ADCs with respect to the offset average signal, for each of the partial converted digital signals of the respective sub-ADC outputs; and
E. a compensation unit responsive to the partial converted digital signals of the respective sub-ADC outputs and the correction signals provided at the subtraction unit output, to generate at a system output of the analog to digital conversion device, a sequence of digital samples at the system sampling rate S corresponding to all portions of the input analog signal and characterized by substantially no DC offset mismatch for the respective portions of the input analog signal.

13. An analog to digital conversion device according to claim 12, wherein the DC offsets accumulator comprises:
A. a subtracting adder having:
i. a first adder input coupled to receive in interleaved sequence, the partial converted digital signals at the respective sub-ADC outputs,
ii. second adder input, and
iii. an adder output,
wherein the subtracting adder provides at the adder output of the subtracting adder, a corresponding sequence of difference values wherein each difference values corresponds to a difference between a corresponding one of the partial converted digital signals at the respective sub-ADC outputs at the first adder input of the subtracting adder, and a corresponding one of a sequence of shifted values at the second adder input of the subtracting adder;

B. a multiplier having:
  i. a first multiplier input coupled to the adder output of the subtracting adder,
  ii. a second multiplier input coupled to a TCF value representative of a time constant, and
  iii. a multiplier output,
  wherein for the sequence of difference values at the first multiplier input, the multiplier provides at the multiplier output, a corresponding sequence of multiplied values corresponding to a sequence of products of the respective difference values at the first multiplier input and the TCF value coupled to the second multiplier input;

C. a summing adder having:
  i. a first adder input coupled to the multiplier output to receive the sequence of multiplied values;
  ii. a second adder input coupled to the second adder input of the subtracting adder, for receiving the sequence of shifted values, and
  iii. an adder output,
  wherein for the sequence of multiplied values at the first adder input of the summing adder and the sequence of shifted values at the second adder input of the summing adder, the summing adder provides at the adder output of the summing adder, a corresponding sequence of summed values wherein each summed values corresponds to a sum of a corresponding one of the respective multiplied values at the first adder input of the summing adder, and a corresponding one of a sequence of shifted values at the second adder input of the summing adder; and D. an N-stage shift register having a shift register input coupled to the adder output of the summing adder, and an DC offsets accumulator output coupled to the second adder input of the subtracting adder and the second adder input of the summing adder,
  wherein the N-stage shift register is responsive to an applied clock signal at the system sampling rate S, to shift the sequence of summed values at the adder output of the summing adder, from stage to stage, to the DC offsets accumulator output.

14. An analog to digital conversion device according to claim 13, wherein the averaging unit comprises:

A. a N-stage shift register having a shift register input coupled to the DC offsets accumulator output, and a set of N shift register outputs, wherein each output is coupled to an associated one of the N stages,
  wherein the N-stage shift register of the averaging unit is responsive to an applied clock signal at the system sampling rate S, to sequentially load the sequences of summed values of the DC offsets accumulator output to the respective N stages of the N-stage shift register of the averaging unit, whereby stored values of the respective stages are applied to the respective ones of the N shift register outputs, B. an adder, having N inputs connected to the respective N shift register outputs of the averaging unit, and an adder output, wherein the adder of the averaging unit is responsive to the N inputs of the shift register, to provide at its output, a averaging unit sum representative of a sum the values at the N inputs to the adder, and C. a divider having an input coupled to the output of the adder of the averaging unit, and having an averaging unit output, wherein the adder is operative to provide at the averaging unit output, an average offset signal representative of the averaging unit sum divided by N, wherein the an average offset signal corresponds to an average of the measured DC offsets of the respective sub-ADCs.

* * * * *

UNITED STATES PATENT AND TRADEMARK OFFICE
CERTIFICATE OF CORRECTION

PATENT NO.         : 9,172,388 B1
APPLICATION NO.    : 14/735386
DATED              : October 27, 2015
INVENTOR(S)        : Stein et al.

It is certified that error appears in the above-identified patent and that said Letters Patent is hereby corrected as shown below:

In the claims

Column 12, Line 34, claim 14 "the an average offset signal corresponds to an average of" should read "the average offset signal corresponds to an average of."

Signed and Sealed this
Eighth Day of March, 2016

Michelle K. Lee
*Director of the United States Patent and Trademark Office*